(12) United States Patent
Herner

(10) Patent No.: US 7,915,095 B2
(45) Date of Patent: *Mar. 29, 2011

(54) SILICIDE-SILICON OXIDE-SEMICONDUCTOR ANTIFUSE DEVICE AND METHOD OF MAKING

(75) Inventor: S. Brad Herner, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/656,016

(22) Filed: Jan. 13, 2010

(65) Prior Publication Data

US 2010/0177549 A1    Jul. 15, 2010

Related U.S. Application Data

(60) Continuation of application No. 11/898,622, filed on Sep. 13, 2007, now Pat. No. 7,655,509, which is a continuation of application No. 10/986,196, filed on Nov. 12, 2004, now Pat. No. 7,329,565, which is a division of application No. 10/095,962, filed on Mar. 13, 2002, now Pat. No. 6,853,049.

(51) Int. Cl.
*H01L 21/82* (2006.01)
(52) U.S. Cl. .............. 438/131; 438/600; 257/E23.147
(58) Field of Classification Search .......... 438/131, 438/467, 600; 257/E23.147
See application file for complete search history.

(56) References Cited

U.S. PATENT DOCUMENTS

| | | | |
|---|---|---|---|
| 3,414,892 A | 12/1968 | McCormack et al. |
| 3,432,827 A | 3/1969 | Sarno |
| 3,571,809 A | 3/1971 | Nelson |
| 3,573,757 A | 4/1971 | Adams |
| 3,576,549 A | 4/1971 | Hess |
| 3,582,908 A | 6/1971 | Koo |
| 3,629,863 A | 12/1971 | Neale |
| 3,634,929 A | 1/1972 | Yoshida et al. |
| 3,671,948 A | 6/1972 | Cassen et al. |
| 3,699,543 A | 10/1972 | Neale |
| 3,717,852 A | 2/1973 | Abbas et al. |
| 3,728,695 A | 4/1973 | Frohman-Bentchkowsky |
| 3,787,822 A | 1/1974 | Rioult |
| 3,846,767 A | 11/1974 | Cohen |
| 3,863,231 A | 1/1975 | Taylor |
| 3,877,049 A | 4/1975 | Buckley |
| 3,886,577 A | 5/1975 | Buckley |
| 3,922,648 A | 11/1975 | Buckley |

(Continued)

FOREIGN PATENT DOCUMENTS

EP        0 073 486 A2      8/1982

(Continued)

OTHER PUBLICATIONS

"3D Chip-On-Chip Stacking," Semiconductor International, Dec. 1991.

(Continued)

*Primary Examiner* — Thanhha Pham

(74) *Attorney, Agent, or Firm* — The Marbury Law Group, PLLC

(57) ABSTRACT

An antifuse contains a first silicide layer, a grown silicon oxide antifuse layer on a first surface of the first silicide layer, and a first semiconductor layer having a first surface in contact with the antifuse layer.

20 Claims, 9 Drawing Sheets

U.S. PATENT DOCUMENTS

| | | |
|---|---|---|
| 3,980,505 A | 9/1976 | Buckley |
| 3,990,098 A | 11/1976 | Mastrangelo |
| 4,146,902 A | 3/1979 | Tanimoto et al. |
| 4,177,475 A | 12/1979 | Holmberg |
| 4,203,123 A | 5/1980 | Shanks |
| 4,203,158 A | 5/1980 | Frohman-Bentchkowsky et al. |
| 4,229,757 A | 10/1980 | Moussie |
| 4,272,880 A | 6/1981 | Pashley |
| 4,281,397 A | 7/1981 | Neal et al. |
| 4,419,741 A | 12/1983 | Stewart et al. |
| 4,420,766 A | 12/1983 | Kasten |
| 4,442,507 A | 4/1984 | Roesner |
| 4,489,478 A | 12/1984 | Sakurai |
| 4,494,135 A | 1/1985 | Moussie |
| 4,498,226 A | 2/1985 | Inoue et al. |
| 4,499,557 A | 2/1985 | Holmberg et al. |
| 4,500,905 A | 2/1985 | Shibata |
| 4,507,757 A | 3/1985 | McElroy |
| 4,535,424 A | 8/1985 | Reid |
| 4,543,594 A | 9/1985 | Mohsen et al. |
| 4,569,121 A | 2/1986 | Lim et al. |
| 4,630,096 A | 12/1986 | Drye |
| 4,646,266 A | 2/1987 | Ovshinsky et al. |
| 4,672,577 A | 6/1987 | Hirose |
| 4,677,742 A | 7/1987 | Johnson |
| 4,710,798 A | 12/1987 | Marcantonio |
| 4,811,082 A | 3/1989 | Jacobs |
| 4,811,114 A | 3/1989 | Yamamoto et al. |
| 4,820,657 A | 4/1989 | Hughes et al. |
| 4,823,181 A | 4/1989 | Mohsen et al. |
| 4,855,953 A | 8/1989 | Tsukamoto et al. |
| 4,876,220 A | 10/1989 | Mohsen et al. |
| 4,881,114 A | 11/1989 | Mohsen et al. |
| 4,899,205 A | 2/1990 | Hamdy et al. |
| 4,922,319 A | 5/1990 | Fukushima |
| 4,943,538 A | 7/1990 | Mohsen et al. |
| 5,001,539 A | 3/1991 | Inoue et al. |
| 5,070,383 A | 12/1991 | Sinar et al. |
| 5,070,384 A | 12/1991 | McCollum et al. |
| 5,089,862 A | 2/1992 | Warner, Jr. et al. |
| 5,126,290 A | 6/1992 | Lowrey et al. |
| 5,160,987 A | 11/1992 | Pricer et al. |
| 5,166,556 A | 11/1992 | Hsu et al. |
| 5,191,405 A | 3/1993 | Tomita et al. |
| 5,202,754 A | 4/1993 | Bertin et al. |
| 5,233,206 A | 8/1993 | Lee et al. |
| 5,266,912 A | 11/1993 | Kledzik |
| 5,283,468 A | 2/1994 | Kondo et al. |
| 5,306,935 A | 4/1994 | Esquivel et al. |
| 5,311,039 A | 5/1994 | Kimura et al. |
| 5,334,880 A | 8/1994 | Abadeer et al. |
| 5,365,105 A | 11/1994 | Liu et al. |
| 5,391,518 A | 2/1995 | Bhushan |
| 5,391,907 A | 2/1995 | Jang |
| 5,398,200 A | 3/1995 | Mazure et al. |
| 5,422,435 A | 6/1995 | Takiar et al. |
| 5,426,566 A | 6/1995 | Beilstein, Jr. |
| 5,427,979 A | 6/1995 | Chang |
| 5,434,745 A | 7/1995 | Shokrgozar et al. |
| 5,441,907 A | 8/1995 | Sung et al. |
| 5,453,952 A | 9/1995 | Okudaira |
| 5,463,244 A | 10/1995 | De Araujo et al. |
| 5,468,997 A | 11/1995 | Imai et al. |
| 5,471,090 A | 11/1995 | Deutsch |
| 5,481,133 A | 1/1996 | Hsu |
| 5,495,398 A | 2/1996 | Takiar et al. |
| 5,502,289 A | 3/1996 | Takiar et al. |
| 5,521,440 A | 5/1996 | Iranmanesh |
| 5,523,622 A | 6/1996 | Harada et al. |
| 5,523,628 A | 6/1996 | Williams et al. |
| 5,535,156 A | 7/1996 | Levy et al. |
| 5,536,968 A | 7/1996 | Crafts et al. |
| 5,552,963 A | 9/1996 | Burns |
| 5,561,622 A | 10/1996 | Bertin et al. |
| 5,581,498 A | 12/1996 | Ludwig et al. |
| 5,585,675 A | 12/1996 | Knopf |
| 5,640,343 A | 6/1997 | Gallagher et al. |
| 5,654,220 A | 8/1997 | Leedy |
| 5,663,591 A | 9/1997 | Iranmanesh |
| 5,675,547 A | 10/1997 | Koga |
| 5,693,552 A | 12/1997 | Hsu |
| 5,696,031 A | 12/1997 | Wark |
| 5,703,747 A | 12/1997 | Voldman et al. |
| 5,737,259 A | 4/1998 | Chang |
| 5,745,407 A | 4/1998 | Levy et al. |
| 5,751,012 A | 5/1998 | Wolstenholme et al. |
| 5,776,810 A | 7/1998 | Guterman et al. |
| 5,780,925 A | 7/1998 | Cipolla et al. |
| 5,781,031 A | 7/1998 | Bertin et al. |
| 5,793,697 A | 8/1998 | Scheuerlein |
| 5,801,437 A | 9/1998 | Burns |
| 5,831,325 A | 11/1998 | Zhang |
| 5,835,396 A | 11/1998 | Zhang |
| 5,838,530 A | 11/1998 | Zhang |
| 5,883,409 A | 3/1999 | Guterman et al. |
| 5,915,167 A | 6/1999 | Leedy |
| 5,937,281 A | 8/1999 | Wu |
| 5,969,380 A | 10/1999 | Syyedy |
| 5,976,953 A | 11/1999 | Zavracky et al. |
| 5,978,258 A | 11/1999 | Manning |
| 5,985,693 A | 11/1999 | Leedy |
| 5,991,193 A | 11/1999 | Gallagher et al. |
| 5,994,757 A | 11/1999 | Ichikawa et al. |
| 6,034,882 A | 3/2000 | Johnson et al. |
| 6,051,851 A | 4/2000 | Ohmi et al. |
| 6,055,180 A | 4/2000 | Gudesen et al. |
| 6,057,598 A | 5/2000 | Payne et al. |
| 6,072,234 A | 6/2000 | Camien et al. |
| 6,087,722 A | 7/2000 | Lee et al. |
| 6,103,555 A | 8/2000 | Choi |
| 6,110,278 A | 8/2000 | Saxena |
| 6,130,835 A | 10/2000 | Scheuerlein |
| 6,133,640 A | 10/2000 | Leedy |
| 6,150,705 A | 11/2000 | Chen |
| 6,185,122 B1 | 2/2001 | Johnson et al. |
| 6,197,641 B1 | 3/2001 | Hergenrother et al. |
| 6,208,545 B1 | 3/2001 | Leedy |
| 6,249,010 B1 | 6/2001 | Bergemont et al. |
| RE37,259 E | 7/2001 | Ovshinsky |
| 6,281,042 B1 | 8/2001 | Ahn et al. |
| 6,291,858 B1 | 9/2001 | Ma et al. |
| 6,307,257 B1 | 10/2001 | Huan et al. |
| 6,314,013 B1 | 11/2001 | Ahn et al. |
| 6,322,903 B1 | 11/2001 | Siniaguine et al. |
| 6,323,536 B1 | 11/2001 | Cutter et al. |
| 6,337,521 B1 | 1/2002 | Masuda |
| 6,351,028 B1 | 2/2002 | Akram |
| 6,353,265 B1 | 3/2002 | Michii |
| 6,355,501 B1 | 3/2002 | Fung et al. |
| 6,420,215 B1 | 7/2002 | Johnson et al. |
| 6,504,753 B1 | 1/2003 | Scheuerlein et al. |
| 6,509,624 B1 | 1/2003 | Radens et al. |
| 6,509,638 B2 | 1/2003 | Fujimoto et al. |
| 6,515,904 B2 | 2/2003 | Moore |
| 6,545,898 B1 | 4/2003 | Scheuerlein |
| 6,549,447 B1 | 4/2003 | Fricke et al. |
| 6,551,857 B2 | 4/2003 | Leedy |
| 6,567,287 B2 | 5/2003 | Scheuerlein |
| 6,574,145 B2 | 6/2003 | Kleveland et al. |
| 6,580,144 B2 | 6/2003 | Anthony |
| 6,593,624 B2 | 7/2003 | Walker |
| 6,618,295 B2 | 9/2003 | Scheuerlein |
| 6,640,178 B2 | 10/2003 | Wakamatsu et al. |
| 6,664,639 B2 | 12/2003 | Cleeves |
| 6,730,543 B2 | 5/2004 | Akram |
| 6,737,675 B2 | 5/2004 | Patel et al. |
| 6,812,575 B2 | 11/2004 | Furusawa |
| 6,841,813 B2 | 1/2005 | Walker et al. |
| 6,853,049 B2 | 2/2005 | Herner |
| 6,881,994 B2 | 4/2005 | Lee et al. |
| 6,888,750 B2 | 5/2005 | Walker et al. |
| 6,897,514 B2 | 5/2005 | Kouznetsov et al. |
| 6,911,723 B2 | 6/2005 | Akram |
| 7,329,565 B2 * | 2/2008 | Herner .......... 438/131 |
| 7,655,509 B2 * | 2/2010 | Herner .......... 438/131 |
| 2001/0054759 A1 | 12/2001 | Nishiura |

| | | | |
|---|---|---|---|
| 2002/0088998 | A1 | 7/2002 | Knall et al. |
| 2002/0140051 | A1 | 10/2002 | Knall et al. |
| 2003/0003632 | A1 | 1/2003 | Cleeves |

FOREIGN PATENT DOCUMENTS

| | | |
|---|---|---|
| EP | 0 387 834 A2 | 9/1990 |
| EP | 0 395 886 A2 | 11/1990 |
| EP | 0 516 866 A1 | 12/1992 |
| EP | 0 606 653 A1 | 7/1994 |
| EP | 0 644 548 A2 | 9/1994 |
| EP | 0 800 137 A1 | 3/1997 |
| JP | 61-222216 | 10/1986 |
| JP | 6-22352 | 4/1995 |
| JP | 63-52463 | 3/1998 |
| WO | WO 94/26083 | 11/1994 |
| WO | WO 01/84553 A2 | 11/2001 |

OTHER PUBLICATIONS

Abou-Samra S.J.: "3D CMOS SOI for High Performance Computing", Low Power Electronics and Design Proceedings, 1998.
Abstract "Closing in on Gigabit DRAMs", Electronic Engineering Times, Nov. 27, 1995, p. 35.
Abstract "IEDM Ponders the 'Gigachip' Era", Electronic Engineering Times, Jan. 20, 1992, p. 33.
Abstract "Interconnects & Packaging", Electronic Engineering Times, Nov. 27, 1995, p. 43.
Abstract "Layers of BST Materials Push Toward 1Gbit DRAM", Electronics Times, Oct. 19, 1995.
Abstract "Looking Diverse Storage", Electronic Engineering Times, Oct. 31, 1994, p. 44.
Abstract "MCMs Hit the Road", Electronic Engineering Times, Jun. 15, 1992, p. 45.
Abstract "MCMs Meld into Systems", Electronic Engineering Times, Jul. 22, 1991, p. 35.
Abstract "Memory Packs Poised 3D Use", Electronic Engineering Times, Dec. 7, 1992, p. 82.
Abstract "Module Pact Pairs Cubic Memory with VisionTek", Semiconductor Industry & Business Survey, vol. 17, No. 15, Oct. 23, 1995.
Abstract "Special Report: Memory Market Startups Cubic Memory: 3D Space Savers", Semiconductor Industry & Business Survey, vol. 16, No. 13, Sep. 12, 1994.
Abstract "Systems EEs See Future in 3D", Electronic Engineering Times, Sep. 24, 1990, p. 37.
Abstract "Tech Watch: 1-Gbit DRAM in Sight", Electronic World News, Dec. 16, 1991, p. 20.
Abstract "Technique Boosts 3D Memory Density", Electronic Engineering Times, Aug. 29, 1994, p. 16.
Abstract "Technologies Will Pursue Higher DRAM Densities", Electronic News (1991), Dec. 4, 1994, p. 12.
Abstract "Wide Application of Low-Cost Associative Processing Associative Processing Seen", Electronic Engineering Times, Aug. 26, 1996, p. 43.
Abstract Lomatch S.: "Multilayered Josephson Junction Logic and Memory Devices", Proceedings of the SPIE—The International Society for Optical Engineering vol. 2157, 1994, pp. 332-343.
Abstract Lu N.C.C.: "Advanced Cell Structures for Dynamic RAMs", IEEE Circuits and Devices Magazine, vol. 5, No. 1, Jan. 1989, pp. 27-36.
Abstract Sakamato K.: "Architecture of Three Dimensional Devices", Journal: Bulletin of the Electrotechnical Laboratory, vol. 51, No. 1, 1987, pp. 16-29.
Akasaka Yoichi: "Three-dimensional IC Trends", Proceedings of the IEEE, vol. 74, No. 12, 1986, pp. 1703-1714.
Akasaka Yoichi: Three-dimensional Integrated Circuit: Technology and Application Prospect, Microelectronics Journal, vol. 20, No. s 1-2, 1989, pp. 105-112.
B.J. Woo et al.: "A Novel Memory Cell Using Flash Array Contactless Eprom (Face) Technology," IEDM, pp. 90-93, 1990, IEEE.
Bertin Claude L.: "Evaluation of a Three-dimensional Memory Cube System", IEEE Transactions on Components, Hybrids, and Manufacturing Technology, vol. 16, No. 8, Dec. 1993, pp. 1006-1011.

Boaz Eitan et al.: "Alternate Metal Virtual Ground (AMG)—A New Scaling Concept for Very High-Density EPROM's," IEEE Electron Device Letters, pp. 450-452, vol. 12, No. 8, Aug. 1991, IEEE.
Boaz Eitan et al.: "Multilevel Flash cells and their Trade-offs," IEEE Electron Device Letters, pp. 169-172, 1996, IEEE.
Bomy Chen et al.: "Yield Improvement for a 3.5-ns BICMOS Technology in a 200-mm Manufacturing Line," IBM Technology Products, 1993, pp. 301-305, VLSITSA.
Camperi-Ginestet C.: "Vertical Electrical Interconnection of Compound Semiconductor Thin-Film Devices to Underlying Silicon Circuitry", IEEE Photonics Technology Letters, vol. 4, No. 9, Sep. 1992, pp. 1003-1006.
Carter William H.: "National Science Foundation (NSF) Forum on Optical Science and Engineering", Proceedings SPIE—The International Society for Optical Engineering, vol. 2524, Jul. 11-12, 1995, (Article by N. Joverst titled "Manufacturable Multi-Material Integration Compound Semi-conductor Devices Bonded to Silicon Circuity".
Chang-Dong Kim et al.: "Short-Channel Amorphous-Silicon Thin-Film Transistors," IEEE Transactions on Electron Devices, pp. 2172-2176, vol. 43, No. 12, Dec. 1996, IEEE.
De Graaf C. et al.: "A Novel High-Density, Low-Cost Diode Programmable Read Only Memory," IEDM, 1996, beginning at p. 189.
Dietmar Gogl et al.: "A 1-Kbit EEPROM in SIMOX Technology for High-Temperature Applications up to 250° C," IEEE Journal of Solid-State Circuits, Oct. 2000, vol. 35, No. 10, IEEE.
Dov Frohman-Bentchkowsky: "A Fully Decoded 2048-Bit Electrically Programmable FAMOS Read-Only Memory," IEEE Journal of Solid-State Circuits, pp. 301-306, vol. sc-6, No. 5, Oct. 1971.
Dr. Heinrich Endert: "Excimer Lasers as Tools for Material Processing in Manufacturing," Technical Digest: International Electron Devices Meeting, 1985, pp. 28-29, Washington, DC, Dec. 1-4, 1985, Göttingen, Germany.
Fumihiko Hayashi et al.: "A Self-Aligned Split-Gate Flash EEPROM Cell with 3-D Pillar Structure," 1999 Symposium on VLSI Technology Digest of Technical Papers, pp. 87-88, Stanford University, Stanford, CA 94305, USA.
G.K. Giust et al.: "High-Performance Laser-Processed Polysilicon Thin-Film Transistors," IEE Electron Device Letters, pp. 77-79, vol. 20, No. 2, Feb. 1999, IEEE.
G.K. Giust et al.: "High-Performance Thin-Film Transistors Fabricated Using Excimer Laser Processing and Grain Engineering," IEEE Transactions on Electron Devices, pp. 925-932, vol. 45, No. 4, Apr. 1998, IEEE.
G.K. Giust et al.: "Laser-Processed Thin-Film Transistors Fabricated from Sputtered Amorphous-Silicon Films," IEEE Transactions on Electron Devices, pp. 207-213, vol. 47, No. 1, Jan. 2000, IEEE.
H. Jiang et al., "Thermal Oxidation of Transition Metal Silicides," *Thin Solid Films*, 1986, pp. 115-129, California Institute of Technology, Pasadena, CA.
Hayashi Y.: "A New Three Dimensional IC Fabrication Technology, Stacking Thin Film Dual-CMOS Layers", IEDM, 1991, pp. 25.6.1-25.6.4.
Hongmei Wang et al.: "Submicron Super TFTs for 3-D VLSI Applications," IEEE Electron Device Letters, vol. 21, No. 9, pp. 439-441, Sep. 2000, IEEE.
Hongmei Wang et al.: "Super Thin-Film Transistor with SOI CMOS Performance Formed by a Novel Grain Enhancement Method," IEEE Transactions on Electron Devices, pp. 1580-1586, vol. 47, No. 8, Aug. 2000, IEEE.
I.D. Kaendler et al., "Structural Characterization of Oxidized Allotaxially Grown $CoSi_2$ Layers By X-Ray Scattering," *Journal of Applied Physics*, Jan. 1, 2000, pp. 133-139, vol. 87, No. 1, American Institute of Physics.
Inoue Y.: "A Three-Dimensional Static RAM", IEEE Electron Device Letters, vol. 7, No. 5, May 1986, pp. 327-329.
Inventor: Mark G. Johnson et al.: "Low Cost Three-Dimensional Memory Array," U.S. Appl. No. 09/638,428, filed Aug. 14, 2000, 25pages.
Inventor: Roy E. Scheuerlein: "Current Sensing Method and Apparatus Particularly Useful for a Memory Array of Cells having Dioke-Like Characteristics," U.S. Appl. No. 09/896,468, filed Jun. 29, 2001, 54 pages.

J. Esquivel et al. "High Density Contactless, Self Aligned EPROM Cell Array Technology," Texas Instruments (Dallas), IEDM 86, pp. 592-595, 1986, IEEE.

Jin-Woo Lee et al.: "Improved Stability of Polysilicon Thin-Film Transistors under Self-Heating and High Endurance EEPROM Cells for Systems-On-Panel," IEEE Electron Device Letters, 1998, pp. 265-268, IEEE.

Johan H. Klootwijk et al.: "Deposited Inter-Polysilicon Dielectrics for Nonvolatle Memories," IEEE Transactions on Electron Devices, pp. 1435-1445, vol. 46, No. 7, Jul. 1999, IEEE.

John H. Douglas: "The Route to 3-D Chips," High Technology, Sep. 1983, pp. 55-59, vol. 3, No. 9, High Technology Publishing Corporation, Boston, MA.

Jung-Hoon Oh et al.: "A High-Endurance Low-Temperature Polysilicon Thin-Film Transistor EEPROM Cell," pp. 304-306, IEEE Electron Device Letters, vol. 21, No. 6, Jun. 2000, IEEE.

K. Miyashita etal.: "Optimized Halo Structure for 80 nm Physical Gate CMOS Technology with Indium and Antimony Highly Angled Ion Implantation," IEDM 99-645, pp. 27.2.1-27.2.4, 1999, IEEE.

Kenji Taniguchi et al.: "Process Modeling and Simulation: Boundary Conditions for Point Defect-Based Impurity Diffusion Model," IEEE Transactions on Computer-Aided Design, pp. 1177-1183, vol. 9, No. 11, Nov. 1990, IEEE.

Kim C. Hardee et al.: "A Fault-Tolerant 30 ns/375 mW 16K×1 NMOS Static RAM," IEEE Journal of Solid-State Circuits, Oct. 1981, vol. SC-16, No. 5, pp. 435-443.

Kuniyoshi Yoshikawa et al.: "An Asymmetrical Lightly Doped Source Cell for Virtual Ground High-Density EPROM's," IEEE Transactions on Electron Devices, pp. 1046-1051, vol. 37, No. 4, Apr. 1990, IEEE.

Kurokawa Takakazu: "3-D VLSI Technology in Japan and an Example: A Syndrome Decoder for Double Error Correction", FGCS—Future, Generation, Computer, Systems, vol. 4, No. 2, 1988, pp. 145-155, Amsterdam, The Netherlands.

M. Arienzo et al.: "Diffusion of Arsenic in Bilayer Polycrystalline Silicon Films," J. Appl. Phys., Jan. 1984, pp. 365-369, vol. 55, No. 2, American Institute of Physics.

Makiniak David: "Vertical Integration of Silicon Allows Packaging of Extremely Dense System Memory In Tiny Volumes: Memory-chip Stacks Send Density Skyward", Electronic Design, No. 17, Aug. 22, 1994, pp. 69-75, Cleveland Ohio.

Marvin H. White et al. "On the Go With Sonos," Circuit & Devices, pp. 22-31, Jul. 2000, IEEE.

Min Cao et al.: "A High-Performance Polysilicon Thin-Film Transistor Using XeCl Excimer Laser Crystallization of Pre-Patterned Amorphous Si Films," IEEE Transactions on Electron Devices, Apr. 1996, pp. 561-567, vol. 43, No. 4, IEEE.

Mino Cao et al.: "A Simple EEPROM Cell Using Twin Polysilicon Thin Film Transistors," IEEE Electron Device Letters, Aug. 1994, pp. 304-306, vol. 15, No. 8, IEEE.

N.D. Young et al.: "The Fabrication and Characterization of EEPROM Arrays on Glass Using a Low-Temperature Poly-Si TFT Process," IEEE Transactions on Electron Devices, pp. 1930-1936, vol. 43, No. 11, Nov. 1996, IEEE.

Nae-In Lee et al.: "High-Performance EEPROM's Using N- and P-Channel Polysilicon Thin-Film Transistors with Electron Cyclotron Resonance N2O-Plasma Oxide," pp. 15-17, IEEE Electron Device Letters, vol. 20, No. 1, Jan. 1999, IEEE.

Noriaki Sato et al.: "A New Programmable Cell Utilizing Insulator Breakdown," IEDM 85, pp. 639-642, 1985, IEEE.

O. Bellezza et al.: "A New Self-Aligned Field Oxide Cell for Multimegabit Eproms," IEDM, 1989, pp. 579-582, IEEE.

P. Candelier et al.: "Simplified 0.35-µm Flash EEPROM Process Using High-Temperature Oxide (HTO) Deposited by LPCVD as Interpoly Dielectrics and Peripheral Transistors Gate Oxide," IEEE Electron Device Letters, Jul. 1997, pp. 306-308, vol. 18, No. 7, IEEE.

Pein Howard: "Performance of the 3-D Pencil Flash EPROM Cell an Memory Array", IEEE Transactions on Electron Devices, vol. 42, No. 11, Nov. 1995, pp. 1982-1991.

Peter K. Naji et al.: "A 256kb 3.0V 1T1MTJ Nonvolatile Magnetoresistive RAM," 2001 IEEE International Solid-State Circuits Conference, Digest of Technical Papers, ISSCC 2001/Session 7/Technology Directions: Advanced Technologies/7.6, Feb. 6, 2001, pp. 122-123 (including enlargement of figures, totaling 9 pages), and associated Visual Supplement, pp. 94-95,4040-4405 (enlargements of slides submitted, totaling 25 pages).

Qi Xiang et al."Deep Sub-100nm CMOS with Ultra Low Gate Sheet Resistance by NiSi," IEEE, pp. 76-77, 2000, Symposium on VLSI Technology Digest of Technical Papers.

Qiuxia Xu et al.: "New Ti-Salicide Process Using Sb and Ge Preamorphization for Sub-0.2 µm CMOS Technology," IEEE Transactions on Electron Devices, pp. 2002-2009, vol. 45, No. 9, Sep. 1998, IEEE.

R. Kazerounian et al.: Alternate Metal Virtual Ground EPROM Array Implemented in a 0.8 µm Process for Very High Density Applications, IEDM 91, pp. 311-314, 1991, IEEE.

R.T. Tung, "Oxygen and the Thermal Stability of Thin $CoSi_2$ Layers," *Applied Physics Letters*, May 18, 1998, pp. 2538-2540, vol. 72, No. 20, American Institute of Physics.

Reber M.: "Benefits of Vertically Stacked Integrated Circuits for Sequential Logic", IEEE, 1996, pp. 121-124.

Richard W. Lay: "TRW Develops Wireless Multiboard Interconnect System," Electronic Engineering Times, Nov. 5, 1994.

S. Mantl et al., "Patterning Method for Silicides Based on Local Oxidation," *Applied Physics Letters*, Dec. 4, 1995, pp. 3459-3461, vol. 67, No. 23, American Institute of Physics.

S.D. Brotherton et al.: "Excimer-Laser-Annealed Poly-Si Thin-Film Transistors," IEEE Transactions on Electron Devices, Feb. 1993, pp. 407-413, vol. 40, No. 2, IEEE.

Sakamoto Kaji: "Architecture des Circuits a Trois Dimension (Architecture of Three Dimensional Devices)", Bulletin of the Electrotechnical Laboratory, ISSN 0366-9092, vol. 51, No. 1, 1987, pp. 16-29.

Schlaeppi H.P.: "nd Core Memories using Multiple Coincidence", IRE Transactions on Electronic Computers, Jun. 1960, pp. 192-196.

Schlaeppppi H.P.: "Session V: Information Storage Techniques", International Solid-State Circuits Conference, Feb. 11, 1960, pp. 54-55.

Seok-Woon Lee et al.: "Pd induced lateral crystallization of Amorphous Si Thin Films," Appl. Phys. Lett. 66 (13), pp. 1671-1673, Mar. 27, 1995, American Institute of Physics.

Seungheon Song et al.: "High Performance Transistors with State-of-the-Art CMOS Technologies," IEDM 99, pp. 427-430, 1999, IEEE.

Stephen C.H. Ho et al.: "Thermal Stability of Nickel Silicides in Different Silicon Substrates," Department of Electrical and Electronic Engineering, pp. 105-108, 1998, IEEE.

Stern Jon M.: Design and Evaluation of an Epoxy Three-dimensional Multichip Module, IEEE Transactions on Components, Packaging, and Manufacturing Technology—Part B, vol. 19, No. 1, Feb. 1996, pp. 188-194.

Takeo Shiba et al.: "In Situ Phosphorus-Doped Polysilicon Emitter Technology for Very High-Speed, Small Emitter Bipolar Transistors," IEEE Transactions on Electron Devices, pp. 889-897, vol. 43, No. 6, Jun. 1996, IEEE.

Terril Rob: "3D Packaging Technology Overview and Mass Memory Applications", IEDM, 1996, pp. 347-355.

Thakur Shashidhar: "An Optimal Layer Assignment Algorithm for Minimizing Crosstalk for Three VHV Channel Routing", IEDM, 1995, pp. 207-210.

Toshio Wada et al.: "A 15-ns. 1024-Bit Fully Static MOS RAM," IEEE Journal of Solid-State Circuits, Oct. 1978, vol. SC-13, No. 5, pp. 635-639.

Victor W.C. Chan et al.: "Three Dimensional CMOS Integrated Circuits on Large Grain Polysilicon Films," IEDM, 2000, IEEE.

Vivek Subramanian: "Control of Nucleation and Grain Growth in Solid-Phase Crystallized Silicon for High-Performance Thin Film Transistors," A Dissertation submitted to the Department of Electrical Engineering and the Committee of Graduate Studies of Stanford University, 1998.

Watanabe Hidehiro: "Stacked Capacitor Cells for High-density Dynamic RAMs", IEDM, 1988, pp. 600-603.

Web Page: "Stacked Memory Modules", IBM Technical Disclosure Bulletin, vol. 38, No. 5, 1995.

Web Page: Ja-Hum Ku et al.: "High Performance pMOSFETs With Ni(Si/sub x/Ge/sub 1-x Si/Sub 0.8/Ge/sub 0.2/ gate, IEEE Xplore Citation Web Page," VLSI Technology, 2000.

Web Page: M.C. Poon. et al.: "Thermal Stability of Cobalt and Nickel Silicides in Amorpho Crystalline Silicon," IEEE Xplore Web Page, 1997.

Web Page: Qi Xiang et al.: "Deep sub-100 nm CMOS with Ultra Low Gate Sheet Resista NiSi," IEEE Xplore Web Page, 2000.

Yamazaki K.: "4-Layer 3-D IC Technologies for Parallel Signal Processing", International Electron Devices Meeting Technical Digest, Dec. 9-12, 1990, pp. 25.5.1-25.5.4.

Yamazaki K.: "Fabrication Technologies for Dual 4-KBIT Stacked SRAM", IEDM 16.8., 1986, pp. 435-438.

Yoshihiro Takao et al. "Low-Power and High-Stability SRAM Technology Using a Laser-Recrystallized p-Channel SOI MOSFET," IEEE Transactions on Electron Devices, pp. 2147-2152, vol. 39, No. 9, Sep. 1992, IEEE.

* cited by examiner

SILICIDE-SILICON OXIDE-SEMICONDUCTOR ANTIFUSE DEVICE AND METHOD OF MAKING

FIELD OF THE INVENTION

This application is a continuation of U.S. application Ser. No. 11/898,622, filed Sep. 13, 2007, which is a continuation of U.S. application Ser. No. 10/986,196, filed Nov. 12, 2004, now U.S. Pat. No. 7,329,565, which is a divisional of U.S. application Ser. No. 10/095,962, filed Mar. 13, 2002, now U.S. Pat. No. 6,853,049, all of which are incorporated herein by reference in their entirety.

The present invention is directed generally to semiconductor devices and methods of fabrication and more particularly to an antifuse device and method of fabrication.

BACKGROUND OF THE INVENTION

Antifuse devices are used in write once non-volatile memories. An antifuse device usually contains an insulating antifuse layer between two metal or semiconductor layers. When a programming voltage is applied across the antifuse layer, a conductive link is formed between the metal or semiconductor layers to provide a conductive path between these layers. It is desirable to form antifuse devices with high quality antifuse layers to improve device reliability. Furthermore, it is desirable to form memories with antifuse devices with the smallest possible dimensions in order to increase the device density and decrease the cost of the memory.

BRIEF SUMMARY OF THE INVENTION

A preferred embodiment of the present invention provides an antifuse comprising a first cobalt silicide layer, a grown silicon oxide antifuse layer on a first surface of the first cobalt silicide layer, and a first semiconductor layer having a first surface in contact with the antifuse layer.

Another preferred embodiment of the present invention provides an antifuse array disposed above a substrate. The array comprises a first plurality of first spaced apart rail stacks disposed at a first height in a first direction above the substrate. Each first rail stack comprises a first cobalt silicide layer and a first thermally grown silicon oxide antifuse layer on the first cobalt silicide layer. The array also comprises a second plurality of spaced apart rail stacks disposed at a second height above the first height and in a second direction different from the first direction. Each second rail stack comprises a first intrinsic or lightly doped semiconductor layer of a first conductivity type in contact with the first antifuse layer, and a second heavily doped second semiconductor layer of a first conductivity type above the first semiconductor layer.

Another preferred embodiment of the present invention provides a three dimensional antifuse array disposed above a substrate, comprising a substrate and at least two sets of a plurality of first, laterally spaced apart rail stacks disposed substantially in a first direction. Each set of first rail stacks is disposed at a different height above the substrate. Each first rail stack comprises a first intrinsic or lightly doped semiconductor layer of a first conductivity type, a second heavily doped semiconductor layer of a first conductivity type located over the first semiconductor layer, a first metal or metal silicide layer located over the second semiconductor layer, and a first antifuse layer located on the first metal or metal silicide layer.

The array in this embodiment also comprises at least one set of a plurality of second, laterally spaced apart rail stacks disposed substantially in a second direction different from the first direction. Each set of the second rail stacks is disposed at a height between successive sets of first rail stacks. Each second rail stack comprises a third intrinsic or lightly doped semiconductor layer of a first conductivity type located on the first antifuse layer, a fourth heavily doped semiconductor layer of a first conductivity type located over the third semiconductor layer, a second metal or metal silicide layer located over the fourth semiconductor layer, and a second antifuse layer located on the second metal or metal silicide layer.

Another preferred embodiment of the present invention provides a method of making an antifuse comprising forming a first silicide layer over the substrate, growing an insulating antifuse layer on a first surface of the first silicide layer, and forming a first semiconductor layer on the antifuse layer.

Another preferred embodiment of the present invention provides a method of making a three dimensional antifuse array disposed above a substrate, comprising forming a first set of a plurality of first, laterally spaced apart rail stacks disposed substantially in a first direction above the substrate. Each first rail stack comprises a first intrinsic or lightly doped semiconductor layer of a first conductivity type, a second heavily doped semiconductor layer of a first conductivity type located over the first semiconductor layer, a first metal or metal silicide layer located over the second semiconductor layer, and a first antifuse layer located on the first metal or metal silicide layer.

The method further comprises forming a second set of a plurality of second, laterally spaced apart rail stacks disposed substantially in a second direction different from the first direction, on the first set of first rail stacks. Each second rail stack comprises a third intrinsic or lightly doped semiconductor layer of a first conductivity type located on the first antifuse layer, a fourth heavily doped semiconductor layer of a first conductivity type located over the third semiconductor layer, a second metal or metal silicide layer located over the fourth semiconductor layer, and a second antifuse layer located on the second metal or metal silicide layer.

The method further comprises forming a third set of a plurality of first, laterally spaced apart rail stacks disposed substantially in a first direction, on the second set of second rail stacks. Each first rail stack comprises a first intrinsic or lightly doped semiconductor layer of a first conductivity type located on the second antifuse layer, a second heavily doped semiconductor layer of a first conductivity type located over the first semiconductor layer, a first metal or metal silicide layer located over the second semiconductor layer, and a first antifuse layer located on the first metal or metal silicide layer.

DETAILED DESCRIPTION OF THE PREFERRED EMBODIMENTS

I. Introduction

PCT Published Application number WO 01/84553 published on Nov. 8, 2001, incorporated herein by reference in its entirety, discloses a multi-level memory employing rail stacks. The rail stacks include conductor and semiconductor layers separated by insulating antifuse layers.

Figure 1:
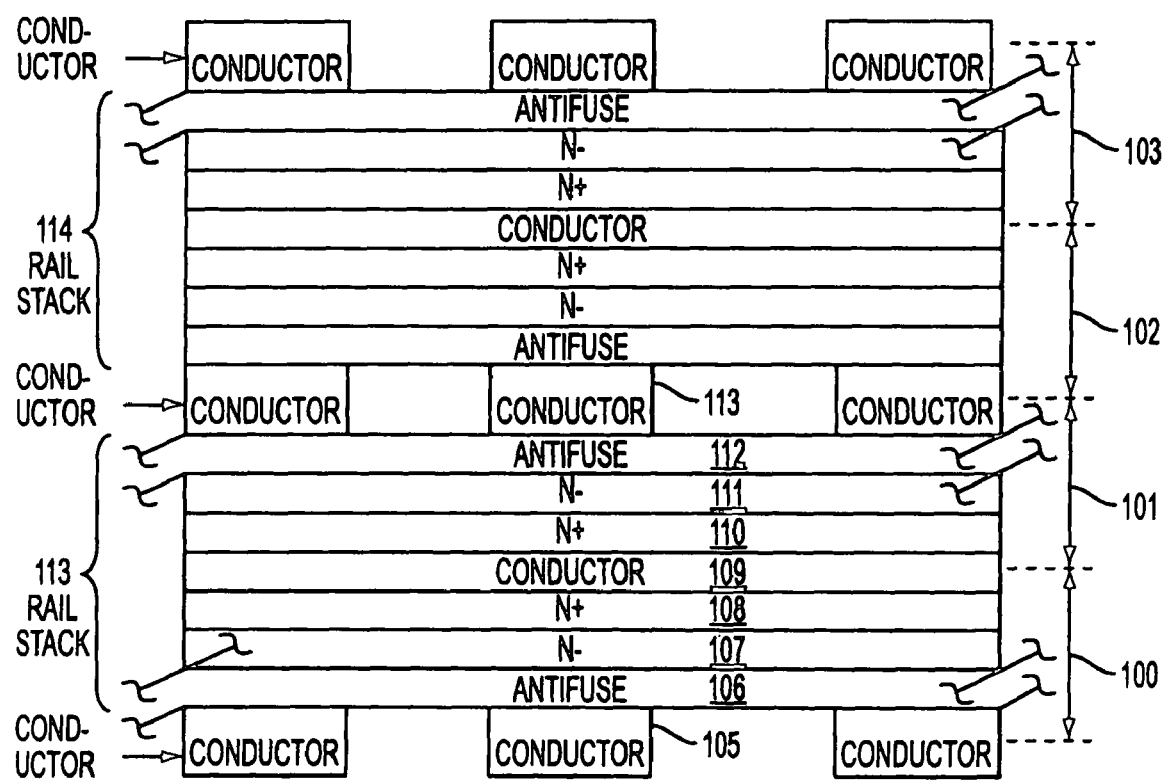
FIG. 1 illustrates a side cross sectional view of a three dimensional memory array.

FIG. 1 illustrates one embodiment of a memory device described in WO 01/84553, where the insulating antifuse layers 106, 112 are located between conductor layers 105, 113 and N− polysilicon layers 107, 111. The memory device also contains N+ polysilicon layers 108 and 110. The memory device shown in FIG. 1 contains four device levels 100, 101, 102 and 103 and two rail stacks 113, 114.

In the embodiment of the memory device of WO 01/84553 shown in FIG. 1, the insulating antifuse layer 106 is deposited on the conductor layer 105. For example, the antifuse silicon dioxide layer 106 may be deposited by a deposition method such as chemical vapor deposition (CVD). However, while CVD silicon dioxide forms an antifuse layer of sufficient quality, a higher quality antifuse layer is desirable.

Furthermore, the rail stacks 113, 114 of WO 01/84553 contain six layers each. Therefore, the rail stacks have a relatively large height. The spaces between adjacent rail stacks in the same device level are filled in with an insulating fill layer. Therefore, adjacent six layer rail stacks in the same level should be spaced relatively far apart in order to avoid high aspect spaces or vias between rail stacks and to ensure proper filling of the spaces between the rail stacks by the insulating fill layer. However, by spacing the adjacent rail stacks further apart, the device density is decreased, which increases the device cost.

The present inventor realized that in one preferred embodiment of the present invention, the quality of the antifuse device is improved if the insulating antifuse layer is grown, preferably thermally grown, rather than deposited on a conductive layer. Furthermore, the present inventor realized that in another preferred embodiment of the invention, reducing the height of the rail stacks allows the spacing between adjacent rail stacks to be reduced and the device density to be increased.

II. The First Preferred Embodiment

An antifuse device of the first preferred embodiment contains a grown antifuse layer on a conductive layer. Preferably, a silicon oxide antifuse layer is thermally grown on a cobalt silicide conductive layer. However, silicide layers other than cobalt silicide, such as platinum silicide, nickel silicide (i.e., NiSi and $NiSi_2$), chromium silicide and niobium silicide, on which silicon oxide may be grown may be used instead. Antifuse layers other than silicon oxide may be also be grown or deposited on the silicide layer. By forming a grown antifuse layer on a silicide layer instead of on a polysilicon layer, more power is delivered to the antifuse layer. Silicon oxide layers grown on silicide layers, such as cobalt silicide layers, can be formed with a greater range of thicknesses without significantly affecting the antifuse breakdown voltage compared to grown silicon oxide layers on silicon.

Silicon oxide antifuse layer preferably comprises the stoichiometric silicon dioxide, but also may include a non-stoichiometric silicon oxide layer (i.e., a layer having a silicon to oxygen ratio of other than 1:2) and silicon oxide containing layers, such as silicon oxynitride (i.e., nitrogen containing silicon oxide). The silicide preferably comprises a stoichiometric silicide, such as $CoSi_2$, PtSi, NiSi, $NiSi_2$, $CrSi_2$ and $NbSi_2$, but also may include a non-stoichiometric silicide layer (i.e., a cobalt silicide layer having a cobalt to silicon ratio of other than 1:2) and a silicide layer containing additive elements other than the primary metal (i.e., cobalt for $CoSi_2$) and silicon.

The term "grown" silicon oxide includes converting a portion of the underlying silicide/silicon film stack to silicon oxide by exposing the silicide layer to an oxygen containing ambient. Without wishing to be bound by any particular theory, it is believed that silicon from the underlying silicon layer in the stack diffuses through the cobalt silicide layer to react with the oxygen containing ambient to form a layer which substantially comprises silicon oxide. For example, the grown oxide may be formed by dry oxidation (i.e., exposing the silicide to an $O_2$ containing gas), wet oxidation (i.e., exposing the silicide to hot steam), plasma enhanced oxidation (i.e., exposing the silicide to an oxygen plasma), chemical oxidation (i.e., exposing the silicide to an oxidizing liquid) and electrochemical oxidation (such as anodic oxidation). In contrast to a "grown" silicon oxide layer, a "deposited" silicon oxide layer is formed on a surface by providing silicon and oxygen atoms to the surface. For example, a silicon oxide layer is deposited by CVD or sputtering.

Preferably, the silicon oxide layer is thermally grown at a temperature above room temperature by dry, wet or plasma oxidation. Most preferably, the silicon oxide layer is grown by exposing the silicide layer to an oxygen atmosphere in a rapid thermal annealing system.

The silicide layer preferably comprises a silicide material on which a silicon oxide layer may be grown. $CoSi_2$, PtSi, NiSi, $NiSi_2$, $CrSi_2$ and $NbSi_2$ are preferred materials for the silicide layer, because they form a mostly silicon oxide layer when exposed to an oxidizing ambient. In contrast, other silicides (such as titanium silicide) can form significant amounts of metal oxide layers (i.e., $TiO_2$) rather than silicon oxide layers when they are exposed to an oxidizing ambient. Metal oxide antifuse layers have an inferior quality to silicon oxide antifuse layers, namely higher leakage currents compared to silicon oxide. Cobalt silicide is most preferred because a good quality oxide layer can be grown on it and because it has the lowest resistivity out of the listed silicides. Low resistivity allows current to be conducted with a thinner layer relative to a layer with higher resistivity. Thinner layers result in smaller devices and require less deposition time. However, the antifuse devices with thicker silicide layers of higher resistivity can also be formed. Cobalt silicide is also preferred because it is stable (i.e., resists agglomeration) up to about 850° C. High temperature stability is desirable because it allows a high quality, high temperature oxide layer to be grown on the silicide and because it allows a wider latitude when integrating the antifuse device with other devices on the chip. NiSi is the second most preferred silicide layer because it has a low resistivity that is comparable $CoSi_2$. However, NiSi is only stable up to about 600° C., and transforms to a higher resistivity $NiSi_2$ above about 600° C. $NiSi_2$ is stable up to about 700° C. Reference is made to a cobalt silicide layer in the description of the preferred antifuse devices below. However, it should be noted that the cobalt silicide layer may be replaced with any of PtSi, NiSi, $NiSi_2$, $CrSi_2$ and $NbSi_2$ in these antifuse devices.

Figure 2:
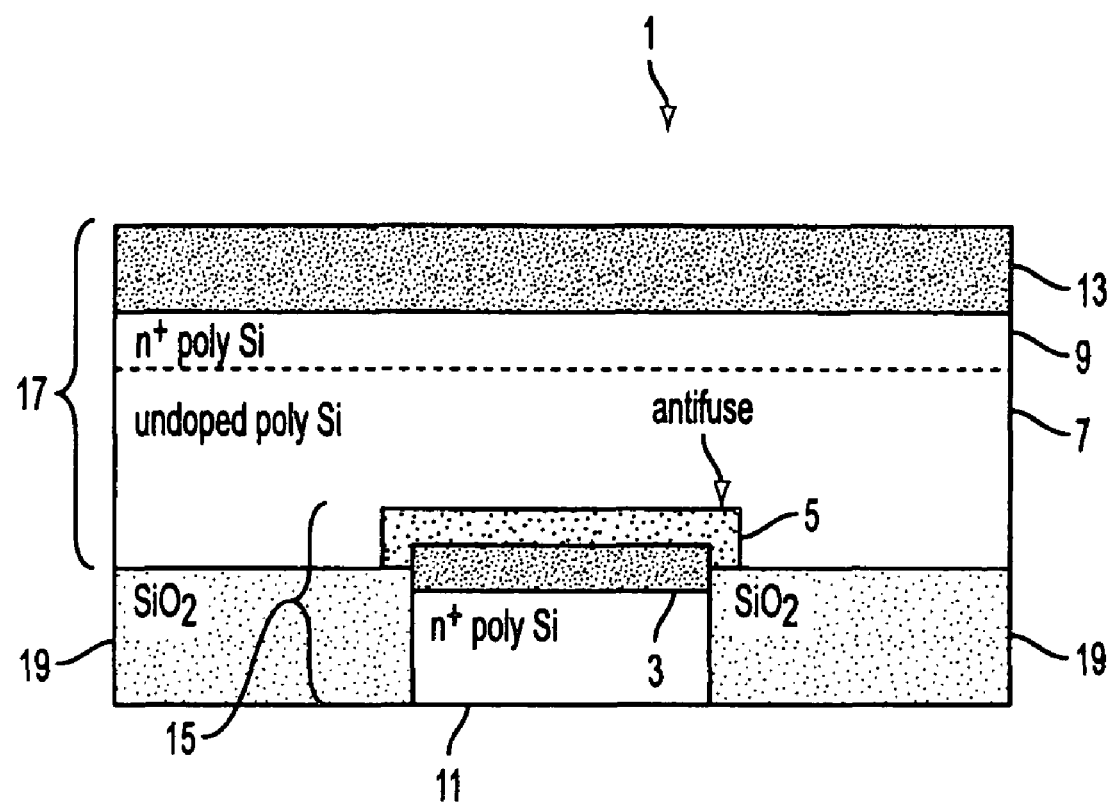
FIG. 2 illustrates a side cross sectional view of an antifuse device according to the first preferred embodiment of the present invention.

FIG. 2 illustrates an antifuse device 1 according to a preferred aspect of the first embodiment. The antifuse device contains a conductive layer, such as a first cobalt silicide layer 3, a grown silicon oxide antifuse layer 5 on a first surface of the first cobalt silicide layer 3, and a first semiconductor layer 7, having a first surface in contact with the antifuse layer 5. Preferably, the layers 3, 5 and 7 are stacked in a vertical direction, such that the first semiconductor layer 7 is formed on the antifuse layer 5 and the antifuse layer 5 is formed on the silicide layer 3, as shown in FIG. 2. However, the layers 3, 5 and 7 may be stacked in a direction other than vertical, such as a horizontal direction (i.e., sideways in FIG. 2), if desired.

The antifuse layer 5 is capable of being selectively breached by passing a programming current between the first cobalt silicide layer 3 and the first semiconductor layer 7 to form a conductive link through layer 5 between layers 3 and 7. Preferably, layer 7 is an intrinsic or lightly doped semiconductor layer (i.e., N- or P-layer having a charge carrier concentration of less than about $10^{18}$ cm$^{-3}$, such as $10^{17}$ cm$^{-3}$).

Preferably, the antifuse device 1 also contains a heavily doped second semiconductor layer 9 of first conductivity type (i.e., N+ or P+ layer having a charge carrier concentration of more than about $10^{18}$ cm$^{-3}$, such as $10^{20}$ cm$^{-3}$). Layer 9 has a first surface in contact with a second surface of the first semiconductor layer 7. Preferably, layer 9 is formed on layer 7, as shown in FIG. 2.

The first semiconductor layer 7 may comprise an intrinsic or lightly doped polysilicon layer or single crystalline silicon layer of a first conductivity type. Layer 7 may also comprise amorphous silicon or other semiconductor layers, such as SiGe or GaAs, if desired. The second semiconductor layer 9 may comprise a heavily doped polysilicon layer or single crystalline silicon layer of a first conductivity type. Preferably, the first and second semiconductor layers comprise polysilicon layers.

The antifuse device 1 also contains an optional heavily doped third semiconductor layer 11, having a first surface in contact with a second surface of the first cobalt silicide layer 3. Preferably, the cobalt silicide layer 3 is formed on the third semiconductor layer 11. The third semiconductor layer 11 comprises a heavily doped polysilicon layer or single crystalline silicon layer. Preferably layer 11 is a polysilicon layer.

The third semiconductor layer 11 may be of the same or opposite conductivity type as the first 7 and second 9 semiconductor layers. Preferably, the first 7, second 9 and third 11 semiconductor layers comprise n-type polysilicon layers. Alternatively, the first 7 and second 9 semiconductor layers comprise n-type polysilicon layers and the third semiconductor layer 11 comprises a p-type polysilicon layer. Of course, the first 7 and second 9 semiconductor layers may comprise p-type polysilicon layers, while the third semiconductor layer 11 may comprise a p-type or n-type polysilicon layer. N-type polysilicon is preferred as the material for layers 7, 9 and 11 because it provides an antifuse device 1 with a lower leakage current than an antifuse device with p-type polysilicon layers.

The antifuse device 1 may also contain a conductive layer, such as a metal or metal silicide layer 13, having a first surface in contact with a second surface of the second semiconductor layer 9. Layer 13 enhances the conductivity of layer 9. Layer 13 may also comprise a cobalt silicide layer. Alternatively, layer 13 may comprise other silicide layers, such as titanium, tungsten or nickel silicide.

The layers 3 to 13 may have any suitable thickness. Preferably, the antifuse layer 5 is 2 to 15 nm thick, such as 4 to 10 nm thick. Preferably, the first 3 and the second 13 cobalt silicide layers may be 30 to 100 nm thick, such as 50 to 70 nm thick. Preferably, the first 7 semiconductor layer is 30 to 800 nm thick, such as 100 to 250 nm thick, most preferably 100 to 200 nm thick. Preferably, the second 9 semiconductor layer is 30 to 500 nm thick, such as 30 to 250 nm, most preferably 30 to 50 nm thick and the third 11 semiconductor layer is 30 to 800 nm thick, such as 100 to 250 nm, most preferably 150 to 200 nm thick.

The antifuse device 1 may have any desired configuration. Preferably, device 1 is laid out in a rail stack configuration. The first metal silicide layer 3, the antifuse layer 5 and the third semiconductor layer 11 are located in a first rail stack 15. The first semiconductor layer 7, the second semiconductor layer 9 and the second cobalt silicide layer 13 are located in a second rail stack 17. The layers in a rail stack preferably have at least one and more preferably two common side surfaces, and have a significantly larger length than width or thickness. The rail stack may be straight (i.e., have a length extending in only one direction) or not straight (i.e., have bends or turns).

While not shown in FIG. 2, other antifuse devices containing first and second rail stacks are located adjacent to the antifuse device 1. A planarized insulating fill layer 19 is located between adjacent first and adjacent second rail stacks of adjacent antifuse devices. The fill layer may comprise any one or more insulating layers, such as silicon oxide, silicon nitride, silicon oxynitride, PSG, BPSG, spin-on glass or a polymer based dielectric, such as polyimide.

The first rail stack 15 is located below the second rail stack 17. Preferably, the first rail stack 15 extends perpendicular to the second rail stack 17. However, the first and the second rail stacks may be disposed at an angle other than 90 degrees with respect to each other.

The antifuse device 1 may be made by any desired method. A method of making the antifuse device 1 according to a preferred aspect of the present invention is shown in FIGS. 3A-3I.

Figure 3A:
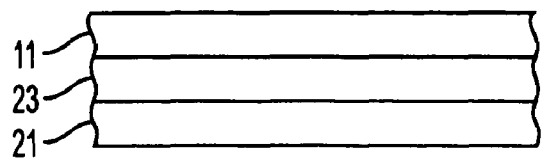
FIGS. 3A-I illustrate side cross sectional views of a preferred method of making the antifuse device of FIG. 2.

The third semiconductor layer 11 is formed on or over a substrate 21, as shown in FIG. 3A. Preferably, layer 11 comprises a heavily doped polysilicon layer formed on one or more interlayer insulating layer(s) 23, such as silicon oxide or silicon nitride, disposed over the substrate 21. However, if desired, layer 23 may comprise a portion of a silicon substrate 21.

Figure 3B:
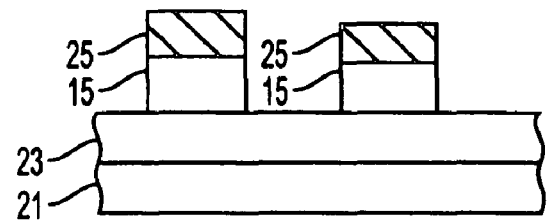

A first masking layer 25, such as a photoresist layer, is formed over layer 11. The third semiconductor layer 11 is patterned (i.e., dry or wet etched) using masking layer 25 to form a plurality of first semiconductor rails 15 disposed in a first direction, as shown in FIG. 3B (the first direction extends into the plane of the page of FIG. 3B). The first masking layer 25 is then removed by conventional removal techniques, such as ashing.

Figure 3C:
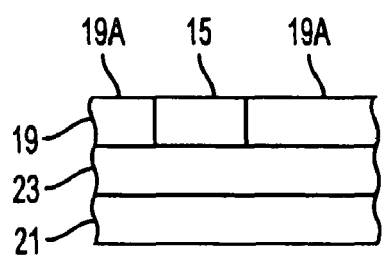

The first insulating fill layer 19 is deposited over and between the first rails 15. Preferably, layer 19 is a silicon oxide layer deposited by a high density plasma (HDP) process or another CVD deposition process. The first insulating fill layer 19 is planarized using chemical mechanical polishing or etchback to form first insulating fill regions 19A between adjacent first rails 15 (only one first rail 15 is shown for clarity in FIG. 3C), such that at least top surfaces of the first rails 15 are exposed, as shown in FIG. 3C.

Figure 3D:
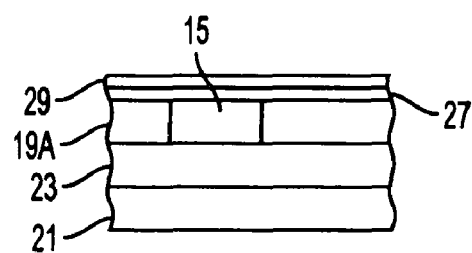

A first cobalt layer 27 is deposited on the first rails 15 and the insulating fill regions 19A, as shown in FIG. 3D. It should be noted that a platinum, nickel, chromium or niobium layer may be deposited instead of the cobalt layer if it is desired to form a silicide of these metals instead. The cobalt layer 27 may be deposited by any suitable deposition method, such as sputtering, to an exemplary thickness of 20 to 50 nm, such as 30 nm. An optional capping layer 29 is deposited on the first cobalt layer 27, as shown in FIG. 3D. The capping layer may be sputter deposited titanium, titanium nitride or any other suitable material. The capping layer assists in the subsequent conversion of the cobalt layer to cobalt silicide. If desired, the capping layer may be omitted.

Figure 3E:
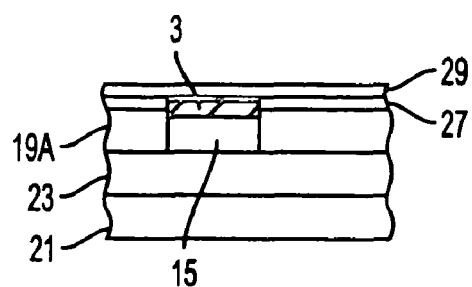

The first cobalt layer 27 is annealed at a suitable temperature to react portions of the first cobalt layer with the polysilicon of the first rails 15 to form a first cobalt silicide layer 3 on the first rails 15, as shown in FIG. 3E. For example, the annealing may be carried out in a rapid thermal annealing system at 400 to 700° C. for 20 to 100 seconds, preferably at 440° C. for 60 seconds. A portion of layer 3 extends above the top surface of regions 19A, while a portion of rail 15 is consumed by the silicide formation. The formation of cobalt silicide on narrow polysilicon rails is also advantageous compared to titanium silicide because cobalt silicide does not suffer from the fine line effect (i.e., the inability to transform the high resistivity C49 phase to the low resistivity C54 phase on narrow linewidths. However, titanium silicide suffers from the fine line effect when it is formed on narrow polysilicon features.

Figure 3F:
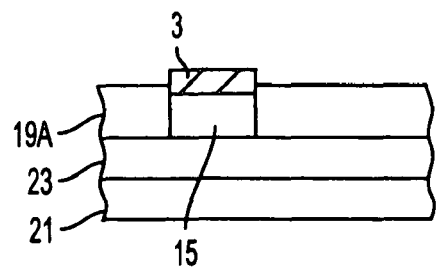

The capping layer 29 and unreacted portions of the first cobalt layer 27 are selectively removed by a selective etch, as shown in FIG. 3F. Any etching medium which selectively etches the capping layer and the cobalt layer over the cobalt silicide layer may be used. Preferably, selective wet etching is used.

The first cobalt silicide layer 3 is then annealed at a second temperature higher than the first temperature to homogenize the cobalt silicide layer. For example, the annealing may be carried out in a rapid thermal annealing system at 550° C. to 800° C. for 30 to 60 seconds, preferably at 740° C. for 40 seconds. Furthermore, the second annealing step may be omitted if the first annealing step is carried out at a temperature above 700° C. Higher temperatures may also be used for the first anneal, such as 1000 to 1200° C., if the second anneal is omitted.

Figure 3G:
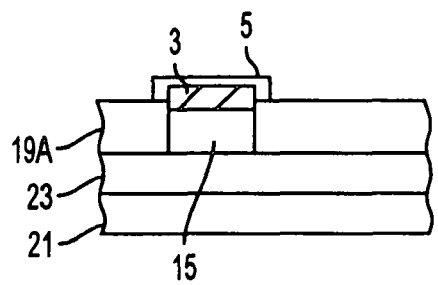

An antifuse layer 5 is selectively thermally grown on the first cobalt silicide layer by exposing the first cobalt silicide layer 3 to an oxygen containing ambient at a temperature above room temperature, as shown in FIG. 3G. Preferably, the first cobalt silicide 3 layer is exposed to oxygen gas in a rapid thermal annealing system at 600° C. to 850° C. for 20 to 60 seconds, preferably at 700° C. to 800° C. for 20 to 30 seconds. Alternatively, a steam ambient (wet oxidation) may be used instead with a temperature of 800 to 1000° C. The growth of thin silicon oxide layers on a cobalt silicide layer by annealing the cobalt silicide layer in an oxygen ambient is described, for example, in R. Tung, Appl. Phys. Lett., 72 (20) (1998) 2358-60; S, Mantl, et al., Appl. Phys. Lett., 67 (23) (1995) 3459-61 and I. Kaendler, et al., J. Appl. Phys., 87 (1) (2000) 133-39, incorporated herein by reference in their entirety. The antifuse layer 5 is formed on the top surface of layer 3 and on portions of side surfaces of layer 3 that extend above insulating fill regions 19A. Silicon oxide layers may be grown on platinum, nickel, chromium and niobium silicide layers by a similar method.

Figure 3H:
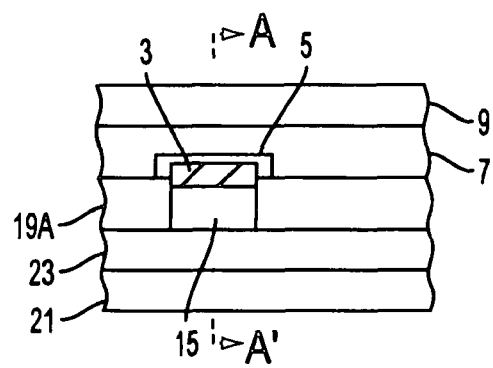

The first semiconductor layer 7 is deposited on the antifuse layer 5. The second semiconductor layer 9 is then deposited on the first semiconductor layer 7, as shown in FIG. 3H. Preferably, both layers comprise in-situ doped n-type polysilicon layers. However, if desired, the second semiconductor layer 9 may be formed by doping the upper portion of the first semiconductor layer 7 with a higher concentration of dopant ions than the lower portion. For example, the doping may be carried out by ion implantation or diffusion after the layer 7 is formed, or by increasing the doping concentration during the deposition of the upper portion of layer 7 compared to the deposition of the lower portion of layer 7.

Figure 3I:
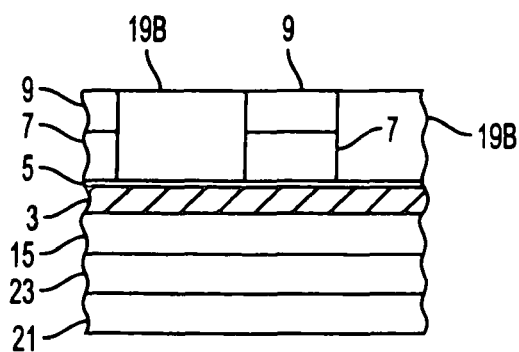

The first 7 and second 9 semiconductor layers are pattered to form second rail stacks 17 extending in a second direction different from the first direction, as shown in FIG. 3I. FIG. 3I is a cross sectional view across line A-A' in FIG. 3H. The rail stacks 17 are formed by forming a second masking layer (not shown) on layer 9 and etching layers 7 and 9 to form the rail stacks 17. A second insulating fill layer is deposited over and between the second rail stacks 17. The second insulating fill layer is planarized using chemical mechanical polishing or etchback to form second insulating fill regions 19B between adjacent the second rail stacks 17, such that at least top surfaces of the second rail stacks are exposed, as shown in FIG. 3I. If desired, the conductive layer, such as a metal or metal silicide layer 13, is formed over layer 9 and regions 19B.

In an alternative method of making the antifuse device 1, the first cobalt silicide layer 3 is formed on the third semiconductor layer 11 before the third semiconductor layer 11 is patterned. For example, the first cobalt silicide layer may be formed by reacting layer 11 with a cobalt layer or by sputter depositing a cobalt silicide layer over layer 11. The first masking layer 25 is then formed on the first cobalt silicide layer 3, and layers 11 and 3 are patterned together to form the first rail stacks 15. Alternatively, the first masking layer 25 is formed on the cobalt layer, the cobalt layer is patterned together with layer 11, and then the patterned cobalt layer is reacted with patterned layer 11 to form the cobalt silicide layer 3 on the first rail stacks 15. The insulating fill layer 19 is then formed and planarized to expose the top surface of the first cobalt silicide layer 3. In this case, the top of the first cobalt silicide layer 3 is planar with the top of the insulating fill regions 19A. This alternative method increases the planarity of the device 1.

A programming voltage is applied such that current is passed between the first cobalt silicide layer 3 and the first semiconductor layer 7 in selected antifuse devices to form a conductive link through the antifuse layer 5 between first cobalt silicide layer and the first semiconductor layer. The programming may be accomplished either in the factory or in the field. A Schottky diode is formed in the programmed antifuse (i.e., a silicide to silicon connection). To sense the data programmed into the antifuse, a voltage lower than the programming voltage is used.

III. The Second Preferred Embodiment

Figure 4:
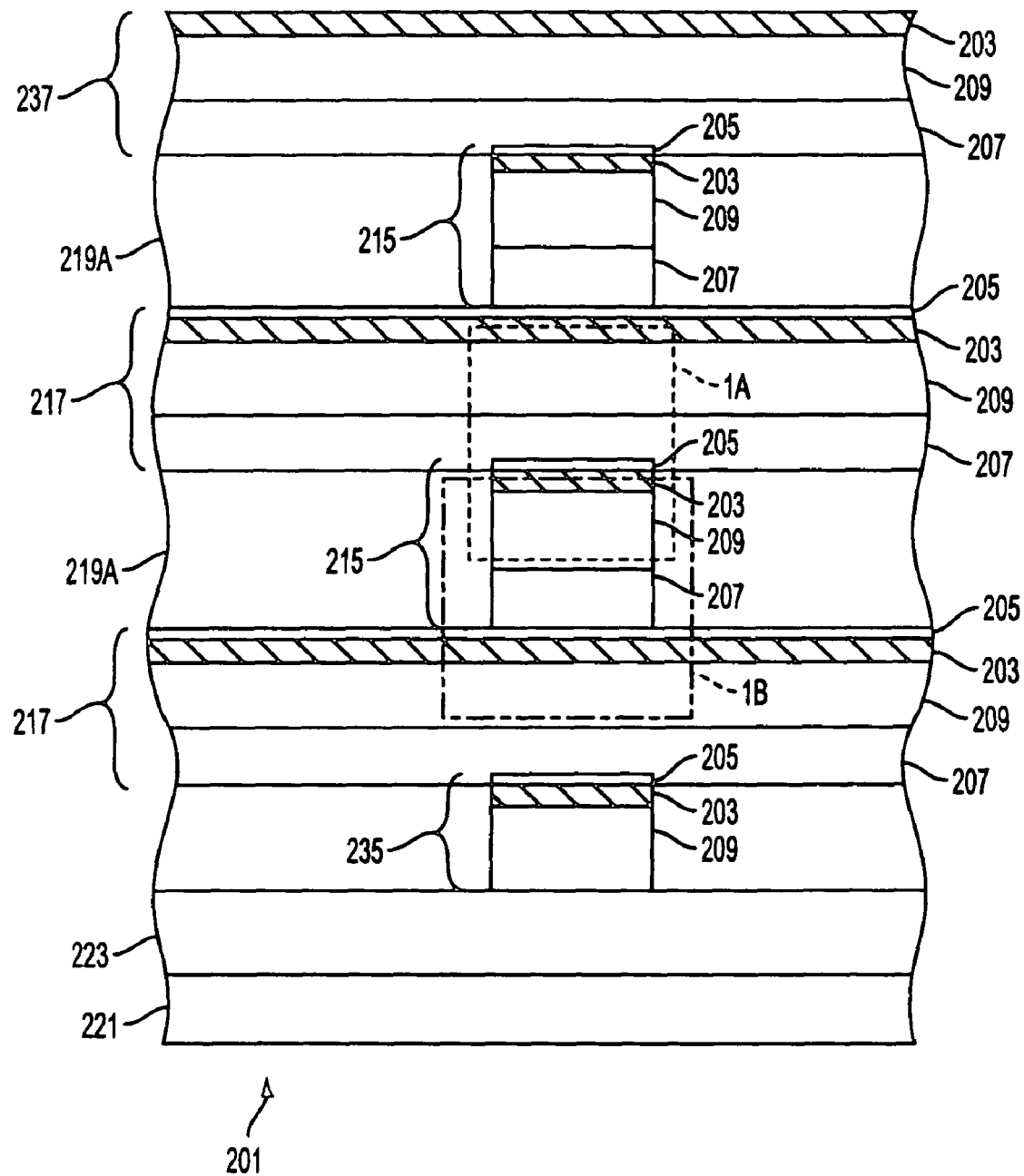
FIG. 4 illustrates a side cross sectional view of a three dimensional memory array according to the second preferred embodiment of the present invention.

In a second preferred embodiment of the present invention, an array 201 of nonvolatile memory devices comprising a three dimensional array of antifuse devices is provided as illustrated in FIG. 4. The array 201 contains at least two sets of a plurality of first, laterally spaced apart rail stacks 215 disposed substantially in a first direction. Each set of first rail stacks 215 is disposed at a different height above a substrate 221.

The array 201 also contains at least one set of a plurality of second, laterally spaced apart rail stacks 217 disposed substantially in a second direction different from the first direction. Each set of the second rail stacks 217 is disposed between successive sets of first rail stacks 215.

The present inventor has realized that reducing the height of the rail stacks allows the spacing between adjacent rail stacks to be reduced and the device density to be increased. Thus, each rail stack 215, 217 may contain four layers rather than six, as shown in FIG. 1. For example, for 0.15 micron wide rail stacks, the aspect ratio may be reduced to about 2:1 from about 3.5:1 by reducing the height of the rail stacks.

The first 215 and second 217 rail stacks are oriented in different directions from each other, but preferably contain the same following four layers. A first intrinsic or lightly doped semiconductor layer of a first conductivity type 207 is provided at the bottom of the stacks. A second heavily doped second semiconductor layer of a first conductivity type 209 is located on or over the first semiconductor layer 207. A metal or metal silicide layer 203 is located on or over the second semiconductor layer 209. An antifuse layer 205 is located on or over the metal or metal silicide layer 203. The first semiconductor layer 207 of each rail stack is located on the antifuse layer of the underlying rail stack. While the rail stacks 215, 217 are described as containing the same layers, the rail stacks 215 and 217 may contain a different number of layers, layers of different composition or thickness, and/or layers arranged in a different order.

Layers 203, 205, 207 and 209 may comprise the same layers having the same thickness ranges as in the first embodiment of FIG. 2. Thus, the metal or metal silicide layer 203 may comprise a cobalt silicide layer, the antifuse layer 205 may comprise a thermally grown silicon oxide layer and the semiconductor layers 207, 209 may comprise undoped or N− and N+ polysilicon layers. However, other materials may be used. For example, tungsten, tantalum, aluminum, copper or metal alloys such as MoW and metal silicides, such as $TiSi_2$, $CoSi_2$, or conductive compounds such as TiN may be used as layer 203. Thermally grown or deposited dielectric such as silicon dioxide, silicon nitride, silicon oxynitride, amorphous carbon, other insulating materials or combinations of materials or undoped amorphous silicon may be used for the antifuse layer 205. Single crystal silicon, polysilicon, amorphous silicon or other compounds semiconductors may be used for layers 207 and 209. The array 201 further comprises a planarized insulating fill layer or regions 219A located between adjacent first rail stacks 215 and adjacent second rail stacks 217 (not shown in FIG. 4).

The array 201 may have any number of rail stacks 215, 217. For example, there may be two to eight rail stacks 215 and one to seven rail stacks 217. Preferably, there are at least three sets of first rail stacks 215 and at least two sets of second rail stacks 217.

Preferably, the first 215 and the second 217 rail stacks are disposed perpendicular to each other. However, the first rail stacks may deviate from a first direction by 1-30 degrees, such that they are disposed "substantially" in the first direction. The second rail stacks may deviate from the second direction by 1-30 degrees, such that they are disposed "substantially" in the second direction. Thus, the first and second rail stacks are not necessarily perpendicular to each other.

If desired, the array 201 may also contain a first partial rail stack 235 disposed below a lower most first or second rail stack, as shown in FIG. 4. The first partial rail stack 235 comprises a cobalt silicide layer 203 and an antifuse layer 205 on the cobalt silicide layer. If desired, layer 203 may be disposed on a heavily doped semiconductor layer 209.

If desired, the array 201 may also contain a second partial rail stack 237 disposed above an upper most first or second rail stack, as shown in FIG. 4. The second partial rail stack 237 comprises an intrinsic or lightly doped semiconductor layer 207 of a first conductivity type, a heavily doped second semiconductor layer 209 of a first conductivity type located over the fifth semiconductor layer, and a metal or metal silicide layer 203 located over the layer 209.

A bit can be stored at each of the intersections of the first and the second rail stacks. However, there are no physically discrete individual memory cells at the intersections. Rather, memory cells are defined by the rail stack intersections. This makes it easier to fabricate the memory array. The term "memory cell" is intended broadly to encompass physically discrete elements or elements that are defined by the rail stacks, or any other localized region where a bit can be stored. When the array is fabricated all the bits are in the zero (or one) state and after programming, the programmed bits are in the one (or zero) state.

The metal or metal silicide layers 203 at each level are either bitlines or wordlines, depending on the programming voltage applied. This simplifies the decoding and sensing and more importantly reduces processing. Thus, antifuse devices vertically overlap each other. It should be noted that the Schottky diodes in array 201 of FIG. 4 are arranged in a "totem pole" configuration. In other words, the Schottky diodes are stacked in the same direction, with the silicide layers 203 located between the N+ polysilicon layer 209 and the antifuse layer 205. In contrast, the Schottky diodes of the array of FIG. 1 are arranged back to back, where the alternating Schottky diodes are stacked in opposite directions (i.e., the Schottky diode containing antifuse layer 106 is upside down compared to the Schottky diode containing antifuse layer 112). In other words, in FIG. 1, the first conductor 109 is located between two N+ polysilicon layers 108, 110, while the second conductor 113 is located between two antifuse layers 112.

For example, one antifuse device 1A is shown by dashed lines in FIG. 4. The device 1A is formed in the heavily doped semiconductor layer 209, the metal or metal silicide layer 203 and the antifuse layer 205 of one first rail stack 215 and in the intrinsic or lightly doped semiconductor layer 207, the heavily doped semiconductor layer 209, and the metal or metal silicide layer 203 of an adjacent second rail stack 217 overlying said first rail stack 215. Another antifuse device 1B shown by dashed and dotted lines in FIG. 4 is formed in the heavily doped semiconductor layer 209, the metal or metal silicide layer 203 and the antifuse layer 205 of one second rail stack 217 and in the intrinsic or lightly doped semiconductor layer 207, the heavily doped semiconductor layer 209, and the metal or metal silicide layer 203 of an adjacent first rail stack 215 overlying said second rail stack 215.

The array 201 is fabricated on a substrate 221 which may be an ordinary monocrystalline silicon substrate. Decoding circuitry, sensing circuits, and programming circuits are fabricated in one embodiment within the substrate 221 under the memory array 201 using, for instance, ordinary MOS fabrication techniques. However, these circuits may also be fabricated above the substrate. An insulating layer 223 is used to separate the rail stacks 215, 217 from the substrate 221. This layer may be planarized with, for instance, chemical-mechanical polishing (CMP) to provide a flat surface upon which the array 201 may be fabricated. Vias are used to connect conductors within the rail stacks to the substrate to allow access to each rail stack in order to program data into the array and to read data from the array. For instance, the circuitry within the substrate 221 may select two particular rail stacks in order to either program or read a bit associated with the intersection of these rail stacks.

The array 201 may be made by any desired method. For example, if the array contains cobalt silicide and thermally grown antifuse silicon oxide layer, then the array may be made by the method shown in FIGS. 3A-I.

Thus, the first partial rail stack 235 is formed prior to the first rail stack on the insulating layer 223 over the substrate 221. Then, the intrinsic or lightly doped and heavily doped semiconductor layers 207, 209 are deposited on the first partial rail stack 235. The semiconductor layers 207, 209 are patterned using a mask to form a plurality of the first rail stacks 215 disposed in the first direction. An insulating fill layer is formed over and between the first rail stacks 215. The insulating fill layer is planarized using chemical mechanical polishing to form first insulating fill regions 219A between adjacent first rail stacks 215, such that at least top surfaces of the first rail stacks are exposed. During the CMP, a portion of the layer 209 is removed.

A cobalt layer is deposited on the first rail stacks 215 and the first insulating fill regions 219A. An optional capping layer is deposited on the cobalt layer. The cobalt layer is annealed at a first temperature to react portions of the first cobalt layer with the first rails to form the cobalt silicide layer 203 on the first rail stacks 215. The capping layer and unreacted portions of the first cobalt layer are selectively etched away. The cobalt silicide layer 203 is annealed at a second temperature higher than the first temperature. Then the antifuse layer 205 is selectively grown on the cobalt silicide layer 203 by exposing the cobalt silicide layer to an oxygen containing ambient at a temperature above room temperature.

The steps are then repeated for a second rail stack 217 and other subsequent first and second rail stacks. The second partial rail stack 237 is formed over the last full rail stack. Thus, a three dimensional monolithic array is formed (i.e., where all the layers are deposited over the same substrate). Alternatively, one or more rail stacks may be formed over one substrate and then joined to one or more rail stacks formed over a second substrate by any suitable bonding technique to form a non-monolithic three dimensional array.

IV. Specific Examples

Figure 5A:
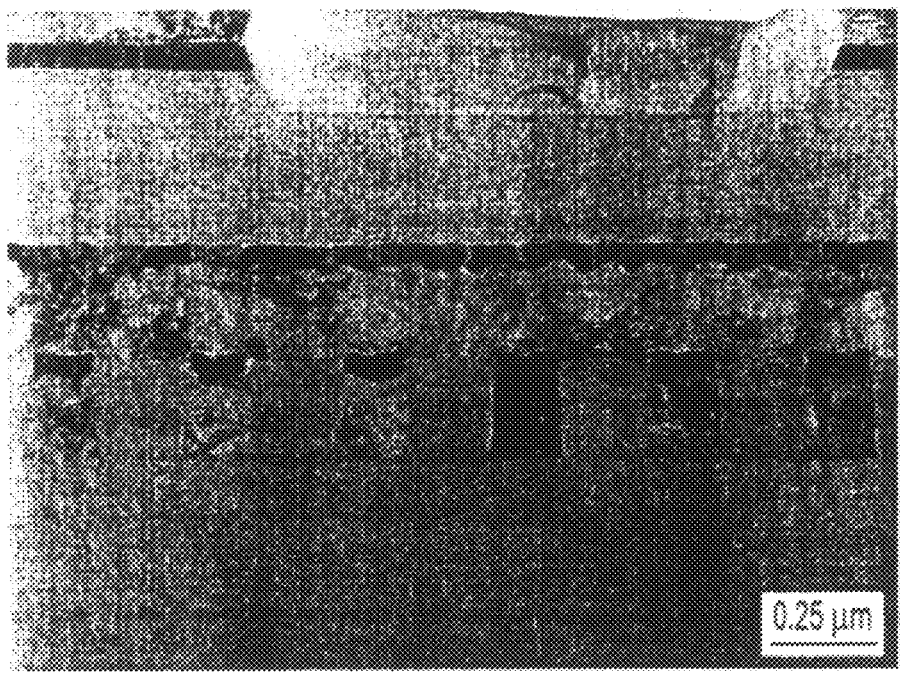
FIGS. 5A and 5B are transmission electron microscopy images of antifuse devices according to the preferred embodiments of the present invention.
Figure 5B:
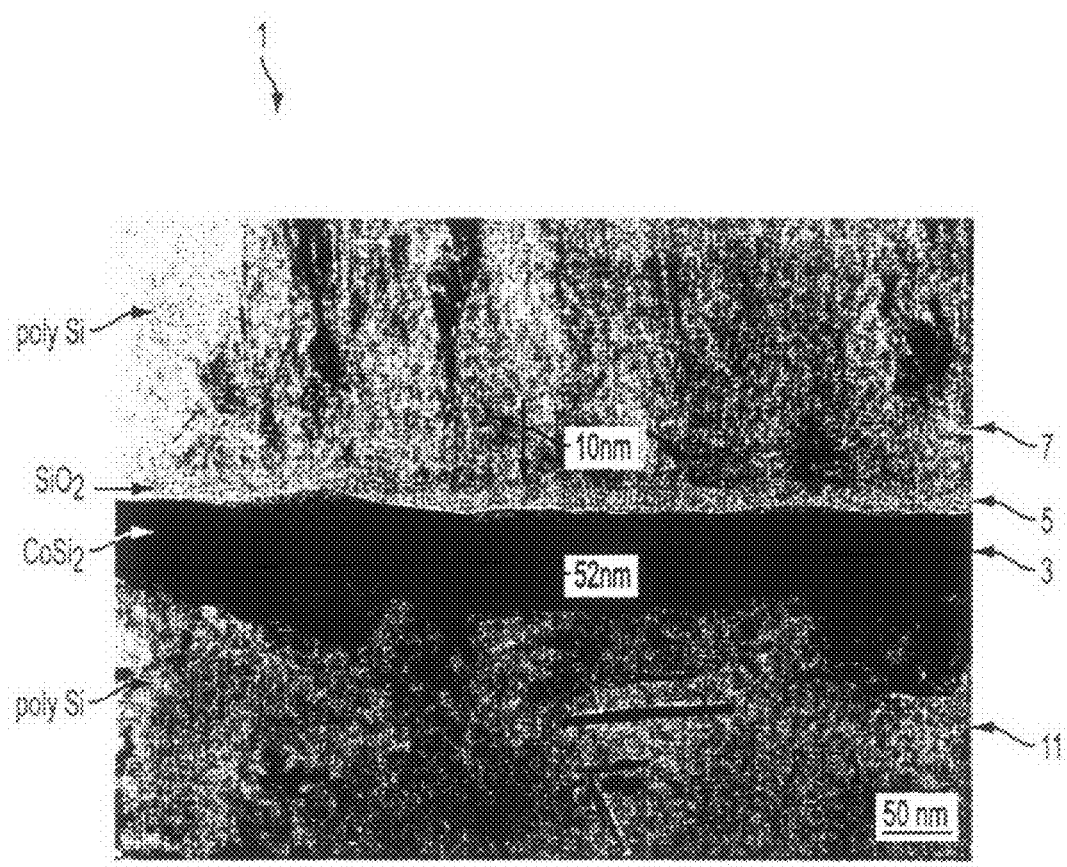

A plurality of antifuse devices shown in FIG. 5A were fabricated. A roughly 50 nm thick cobalt silicide layer was formed on a plurality of N+ polysilicon rails doped $1\times10^{20}$ cm$^{-3}$. A roughly 10 nm silicon dioxide antifuse layer was thermally grown on the cobalt silicide layer, a 200 nm N−polysilicon layer doped $1\times10^{17}$ cm$^{-3}$ was deposited on the antifuse layer, and a 250 nm N+ polysilicon layer doped $1\times10^{20}$ cm$^{-3}$ was deposited on the N−layer. The thickness of the N+ layer was reduced to about 50 nm during the CMP of the insulating fill layer. A transmission electron microscopy (TEM) image of one antifuse device 1 is shown in FIG. 5B. In the middle of FIG. 5B, the thickness of the cobalt silicide layer is 52 nm, and the thickness of the antifuse layer is 10 nm. The thickness of the layers varies somewhat along the length of the device.

To form the cobalt silicide layer, a sputtered cobalt layer and a titanium capping layer were deposited on about 200 nm thick N+ polysilicon rails and annealed in a rapid thermal annealing system at 440° C. for 60 seconds. Portions of the polysilicon rails and the cobalt layer were converted to cobalt silicide. After the unreacted portions of the cobalt layer and the capping layer were selectively etched, the cobalt silicide layer was annealed in the a rapid thermal annealing system at 740° C. for 40 seconds. An antifuse layer was formed on the cobalt silicide layer in a rapid thermal annealing system by exposing the cobalt silicide layer to oxygen at 700° C. for 20 seconds or at 800° C. for 30 seconds.

Figure 6:
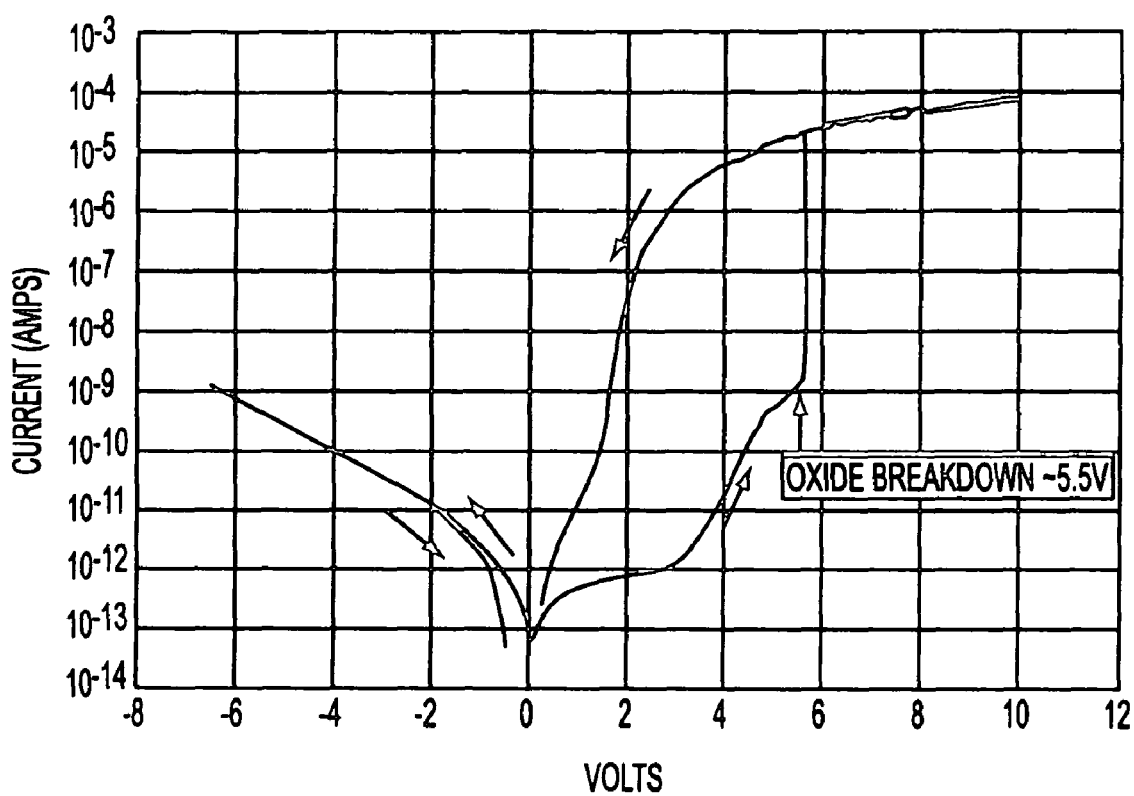
FIGS. 6 and 7 are current-voltage plots of electrical test results on antifuse devices according to the first preferred embodiment of the present invention.
Figure 7:
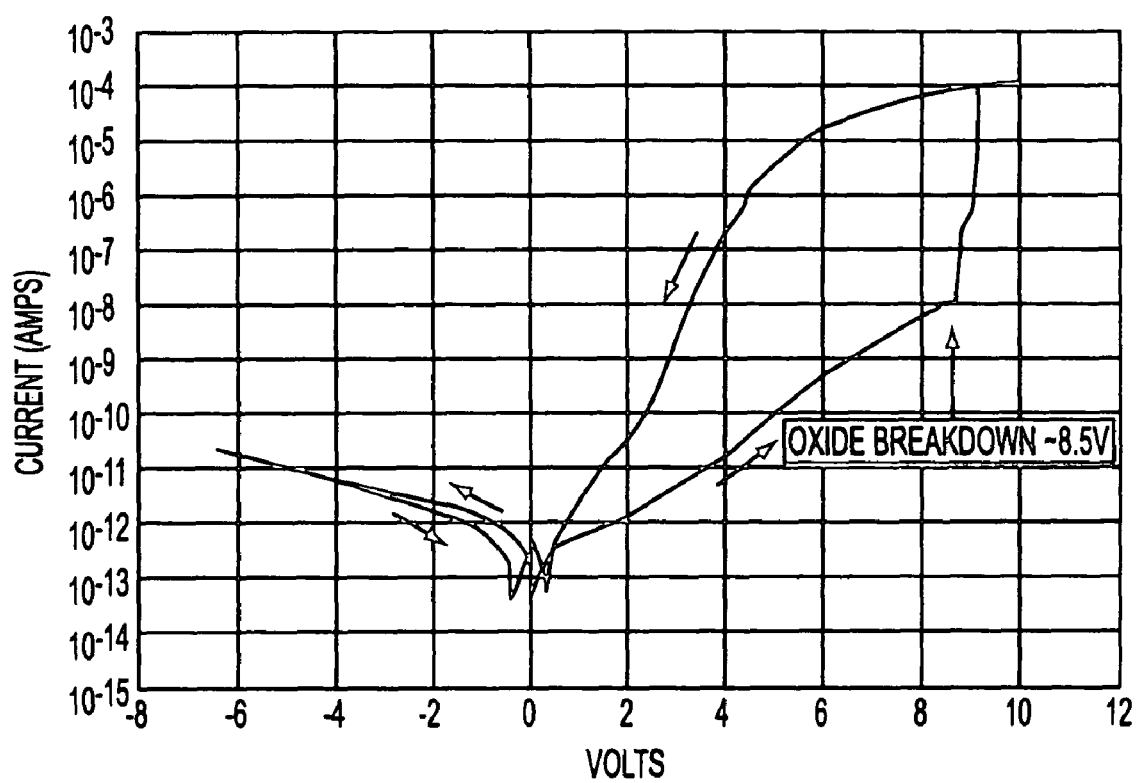

The antifuse devices were electrically tested to determine their breakdown voltage. The current-voltage plots of the electrical tests are shown in FIGS. 6 and 7. When the silicon dioxide antifuse layers were thermally grown in oxygen at 700° C. for 20 seconds, the antifuse devices exhibited a breakdown voltage of about 5.5 volts, as shown in FIG. 6. When the silicon dioxide antifuse layers were thermally grown in oxygen at 800° C. for 30 seconds, the antifuse devices exhibited a breakdown voltage of about 8.5 volts, as shown in FIG. 7.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings are not necessarily to scale and illustrate the device in schematic block format. The drawings and description of the preferred embodiments were chosen in order to explain the principles of the invention and its practical application, and are not meant to be limiting on the scope of the claims. It is intended that the scope of the invention be defined by the claims appended hereto, and their equivalents.

What is claimed is:

1. A method of making an antifuse comprising:
   forming a first silicide layer over a substrate;
   growing an insulating antifuse layer on a first surface of the first silicide layer by converting a portion of the first silicide layer to the insulating antifuse layer; and
   forming a first semiconductor layer on the insulating antifuse layer.

2. The method of claim 1, wherein the first silicide layer is selected from a group consisting of platinum silicide, nickel silicide, chromium silicide and niobium silicide.

3. The method of claim 1, wherein:
   growing the insulating antifuse layer comprises thermally growing a silicon oxide layer; and
   the first semiconductor layer comprises an intrinsic or lightly doped polysilicon or single crystalline silicon layer of a first conductivity type.

4. The method of claim 1, further comprising:
   forming a heavily doped third semiconductor layer over the substrate;
   forming the first silicide layer on the third semiconductor layer; and
   forming a heavily doped second semiconductor layer of a first conductivity type on the first semiconductor layer.

5. The method of claim 4, wherein the first, the heavily doped second and the heavily doped third semiconductor layers comprise n-type polysilicon layers.

6. The method of claim 4, wherein the first and the heavily doped second semiconductor layers comprise n-type polysilicon layers and the heavily doped third semiconductor layer comprises a p-type polysilicon layer.

7. The method of claim 4, further comprising forming a second silicide layer on the heavily doped second semiconductor layer.

8. The method of claim 7, wherein:
   The insulating antifuse layer is 2 to 15 nm thick;
   the first and the second silicide layers are 30 to 100 nm thick;
   the first semiconductor layer is 30 to 800 nm thick;
   the heavily doped second semiconductor layer is 30 to 500 nm thick; and
   the heavily doped third semiconductor layer is 30 to 500 nm thick.

9. The method of claim 7, further comprising:
   patterning the heavily doped third semiconductor layer to form first rails extending in a first direction;
   then forming the first silicide layer on the heavily doped third semiconductor layer; and
   then growing the antifuse layer on the first silicide layer.

10. The method of claim 9, further comprising:
    forming an insulating fill layer over and between the first rails; and planarizing the insulating fill layer using chemical mechanical polishing to form insulating fill regions between adjacent first rails.

11. The method of claim 10, further comprising patterning the first semiconductor layer, the heavily doped second semiconductor layer and the second silicide layer to form a second rail stack disposed in a second direction different than the first direction.

12. The method of claim 11, further comprising:
forming a second antifuse layer on the second silicide layer;
forming an intrinsic or lightly doped fourth semiconductor layer of the first conductivity type on the first antifuse layer;
forming a heavily doped fifth semiconductor layer of the first conductivity type on the intrinsic or lightly doped fourth semiconductor layer;
forming a third silicide layer on the heavily doped fifth semiconductor layer; and
forming a third rail stack disposed in the first direction.

13. The method of claim 4, further comprising:
forming an interlayer insulating layer over the substrate;
forming the heavily doped third semiconductor layer comprising a polysilicon layer on the interlayer insulating layer;
patterning the heavily doped third semiconductor layer to form a plurality of first rails disposed in a first direction;
forming an insulating fill layer over and between the first rails;
planarizing the insulating fill layer using chemical mechanical polishing to form first insulating fill regions between adjacent first rails, such that at least top surfaces of the first rails are exposed;
depositing a first metal layer on the first rails and the insulating fill regions;
forming a first capping layer on the first metal layer;
annealing the first metal layer at a first temperature to react portions of the first metal layer with the first rails to form the first silicide layer on the first rails;
selectively etching the capping layer and unreacted portions of the first layer;
annealing the first silicide layer at a second temperature higher than the first temperature;
growing the insulating antifuse layer on the first silicide layer by exposing the first silicide layer to an oxygen containing ambient at a temperature above room temperature; and patterning the first semiconductor layer and the heavily doped second semiconductor layer to form second rail stacks extending in a second direction different from the first direction.

14. The method of claim 13, wherein:
growing the insulating antifuse layer comprises exposing the first silicide layer to oxygen gas in a rapid thermal annealing system at 600° C. to 850° C. for 20 to 60 seconds;
forming the first semiconductor layer comprises depositing a first polysilicon layer; and
forming the second semiconductor layer comprises depositing a second polysilicon layer on the first polysilicon layer or doping an upper portion of the first polysilicon layer with dopant of the first conductivity type.

15. The method of claim 1, further comprising passing a programming current between the first silicide layer and the first semiconductor layer to form a conductive link through the insulating antifuse layer between first silicide layer and the first semiconductor layer.

16. The method of claim 1, wherein the step of growing the insulating antifuse layer on the first surface of the first silicide layer comprises converting an upper portion of the first silicide layer to silicon oxide by exposing the first silicide layer to an oxygen containing ambient to form a silicon oxide insulating antifuse layer.

17. A method of making an antifuse comprising:
forming a first silicide layer over a substrate;
growing a silicon oxide antifuse layer on a first surface of the first silicide layer by oxidizing a surface of the first silicide layer; and
forming a first semiconductor layer on the silicon oxide antifuse layer.

18. The method of claim 17, wherein:
the first silicide layer is selected from a group consisting of platinum silicide, nickel silicide, chromium silicide and niobium silicide; and
the step of growing the silicon oxide antifuse layer comprises growing the silicon oxide antifuse layer by one of dry thermal oxidation, wet thermal oxidation, plasma enhanced oxidation, chemical oxidation or electrochemical oxidation.

19. The method of claim 18, wherein:
the step of growing the silicon oxide antifuse layer comprises growing the silicon oxide antifuse layer by one of dry thermal oxidation or wet thermal oxidation.

20. The method of claim 17, further comprising programming the antifuse such that a diode is formed in the programmed device.

* * * * *